(12) United States Patent
Lin et al.

(10) Patent No.: US 6,566,722 B1
(45) Date of Patent: May 20, 2003

(54) PHOTO SENSOR IN A PHOTO DIODE ON A SEMICONDUCTOR WAFER

(75) Inventors: Liang-Hua Lin, Hsin-Chu (TW); Anchor Chen, Ping-Tung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/064,256

(22) Filed: Jun. 26, 2002

(51) Int. Cl.$^7$ ................................................ H01L 29/82
(52) U.S. Cl. .................. 257/427; 257/428; 257/414; 257/421
(58) Field of Search ................... 257/428, 430, 257/427, 421, 424, 461, 470, 414, 57

(56) References Cited

U.S. PATENT DOCUMENTS 6,114,740 A * 9/2000 Takimoto et al. ........... 257/461
6,271,553 B1 * 8/2001 Pan ............................. 257/291

* cited by examiner

Primary Examiner—Carl Whitehead, Jr.
Assistant Examiner—Yennhu B Huynh
(74) Attorney, Agent, or Firm—Winston Hsu

(57) ABSTRACT

A method of forming a photo sensor in a photo diode is provided. The photo diode is formed in a semiconductor wafer. The semiconductor wafer includes a substrate with a first conductive type, and an insulating layer surrounding the photo sensor. A first ion implantation process, utilizing dopants with a second conductive type, is performed to form a plurality of first doped regions in the surface of the photo sensor. A second ion implantation process, utilizing dopants with the second conductive type, is performed to form a second doped region in the surface of the photo sensor. The second doped region is overlapped with a portion of each of the first doped regions.

7 Claims, 6 Drawing Sheets

PHOTO SENSOR IN A PHOTO DIODE ON A SEMICONDUCTOR WAFER

BACKGROUND OF INVENTION

1. Field of the Invention

The present invention relates to a method for forming a photo sensor in a photo diode, and more particularly, to a method for forming a photo sensor in a photo diode having better sensitivity to light of short wavelengths.

2. Description of the Prior Art

A complementary metal-oxide-semiconductor (CMOS) image sensor is a common solid-state image sensor. Since a CMOS image sensor device is produced by using conventional semiconductor techniques, the CMOS image sensor has advantages of low cost and reduced device size. In addition, the CMOS image sensor further has advantages of high quantum efficiency and low read-out noise. The CMOS image is therefore commonly used in photoelectric products, such as PC cameras and digital cameras.

A typical CMOS image sensor comprises a photo diode for sensing light, and three metal-oxide semiconductor (MOS) transistors including a reset MOS, a current source follower, and a row selector. The current in the photo diode induced by light represents a signal, whereas the current present in the device in the absence of light represents noise. The photo diode processes signal data by using the value of the signal-to-noise ratio.

Please refer to FIG. 1 . FIG. 1 is a schematic diagram of a prior art photo diode in a photo sensor located on a surface of a semiconductor wafer. As shown in FIG. 1, a semiconductor wafer 10 comprises a silicon substrate 12, a P-type well 14 located on the silicon substrate 12, a photo sensor 16 defined on the P-type well 14, and a shallow trench isolation (STI) 18 surrounding the photo sensor 16. The shallow trench isolation 18 is used to isolate the photo sensor 16 from other electrical devices for preventing an electrical shortage.

In the prior art method of forming the photo sensor 16, an ion implantation process is performed to implant N-type dopants, such as arsenic ions, into the surface of the P-type well 14 with an implantation energy of approximately 80 KeV so as to form an N-type doped region 20 with an implantation concentration of approximately $10^{15}$ cm$^{-2}$. Because the doped region 20 and the P-type well 14 are of different type dopants, a depletion region 22 is therefore formed in a PN junction between the doped region 20 and the P-type well 14. The depletion region 22 is used for sensing light.

Because dopants with a high dosage and a high energy are used in the prior art method to form the doped region 20, the width of the depletion region 22 of the PN junction formed with the doped region 20 and the P-type well 14 is narrower which leads to a smaller real active region of the photo sensor 16. This will decrease the leakage current (also called photo-current) of the PN junction when the photo-diode sensor accepts light. Therefore, the value of the signal-to-noise ratio and the photo-sensibility are reduced.

In addition, the higher implantation energy of the ion implantation process causes a deeper PN junction depth of the doped region 20. Since a short wavelength of light, such as blue light for instance, has a shallow penetration depth in the silicon wafer, the light current induced by the PN junction of the photo diode is small when the photodiode is irradiated by light of short wavelengths. Consequently, the sensitivity of the photodiode for detecting short wavelength light is reduced. Furthermore, the higher implantation energy of the ion implantation process also causes damage on the surface of the doped region 20, which leads to increasing the recombination rate of the photo charges. Therefore, the lifetime of photo charges and the sensitivity of the photo diode are decreased.

SUMMARY OF INVENTION

It is therefore a primary objective of the claimed invention to provide a method for forming a photo sensor in a photo diode for improving the sensitivity of a photo diode.

According to the claimed invention, a semiconductor wafer is firstly provided in the preferred embodiment of the claimed invention. The semiconductor wafer includes a substrate with a first conductive type, and an insulating layer surrounding the photo sensor. A first ion implantation process, utilizing dopants with a second conductive type, is performed to form a plurality of first doped regions in the surface of the photo sensor. A second ion implantation process, utilizing dopants with the second conductive type, is performed to form a second doped region in the surface of the photo sensor. The second doped region is overlapped with a portion of each of the first doped regions.

It is an advantage over the prior art that the claimed invention uses the first ion implantation process to form a plurality of first doped regions. Therefore, the contacting area between each first doped regions and the substrate is increased so that the sensing area of the photo diode is effectively increased. As a result, the sensitivity of the photo diode is improved. In addition, the second doped region is overlapped with the upper portion of each first doped regions, so that the second doped region and the substrate form a depletion region close to the surface of the substrate. Therefore, the sensitivity of the photo diode to light with short wavelengths (such as blue light) is effectively improved.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 1:
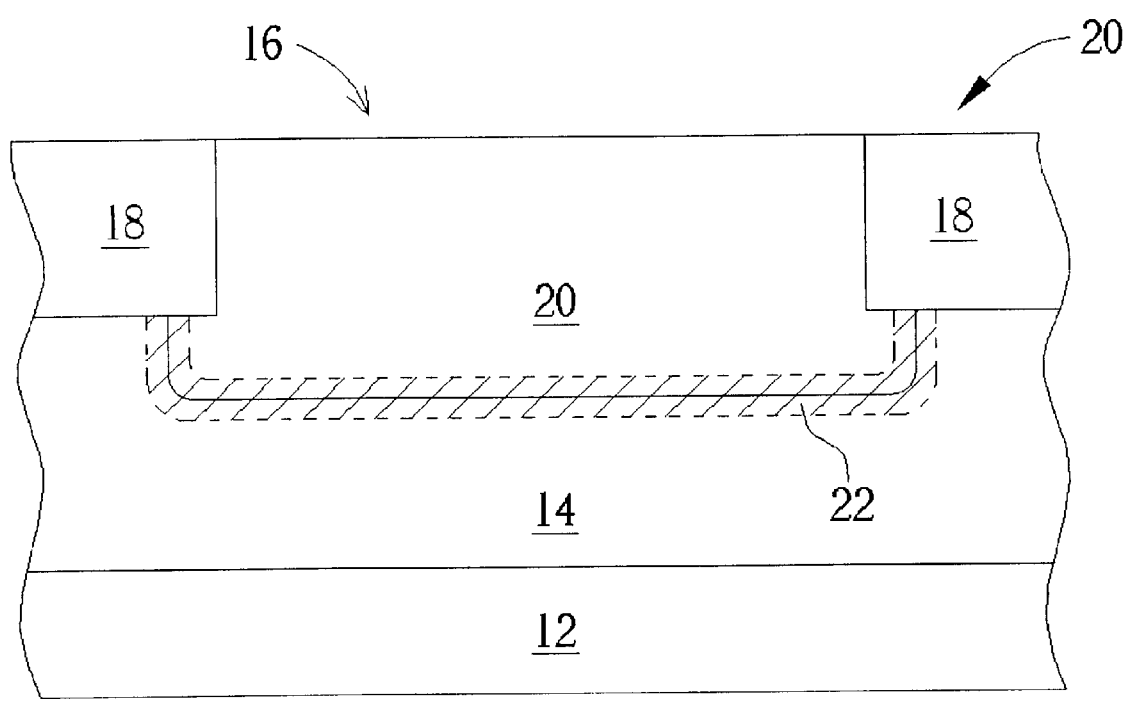
FIG. 1 is a schematic diagram of a prior art photo diode in a photo sensor located on a surface of a semiconductor wafer.
Figure 2:
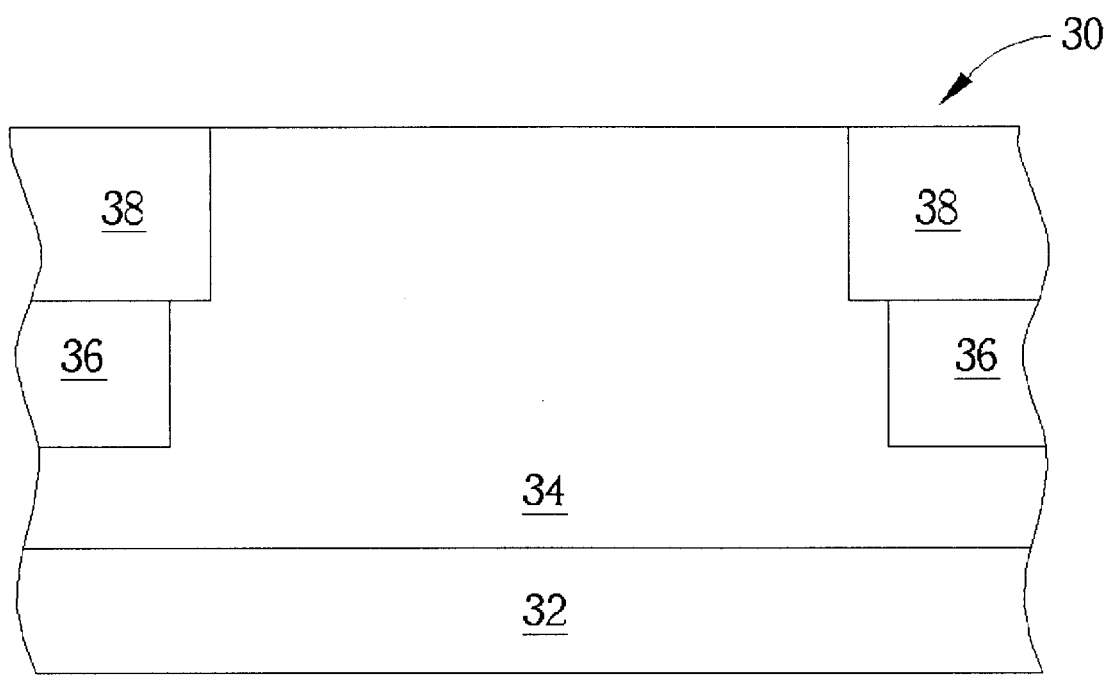
FIG. 2 to FIG. 5 are schematic diagrams for illustrating a method of forming a photo sensor of a photo diode on a surface of a semiconductor wafer.

Please refer to FIG. 2 to FIG. 5. FIG. 2 to FIG. 5 are schematic diagrams for illustrating a method of forming a photo sensor of a photo diode on a surface of a semiconductor wafer. As shown in FIG. 2, a semiconductor wafer 30 comprises a P-type substrate 32, and a plurality of insulating layers 38, such as shallow trench isolation, located on the surface of the P-type substrate 32 for defining a position of the photo sensor. In the preferred embodiment of the present invention, the surface of the P-type substrate 32 further comprises a P-type epitaxial silicon layer 34, and a P-type well 36 is located under the insulating layer 38. The P-type well is used to prevent junction currents produced in the photo sensor from occurring a lateral drift to the neighboring sensor devices. As a result, the cross talk effect is prevented.

Figure 3:
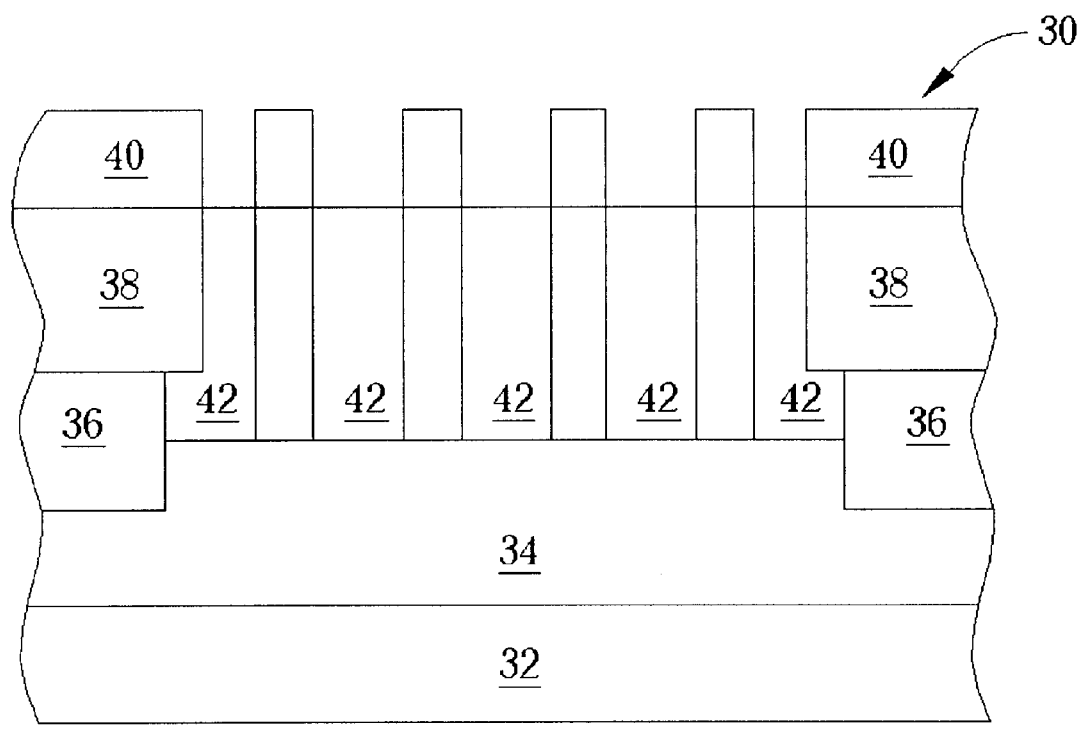

As shown in FIG. 3, a photolithography process is thereafter performed to form a photoresist layer 40 on the surface of the P-type substrate 32 for defining the position of a plurality of lightly doped regions in the photo sensor. Then, a first ion implantation process is performed to implant N-type dopants, such as arsenic (As) or phosphorus (P), into the P-type substrate 32. As a result, a plurality of doped regions 42 is formed. Thereafter, the photoresist layer 40 on the surface of the semiconductor wafer 30 is removed completely.

Figure 4:
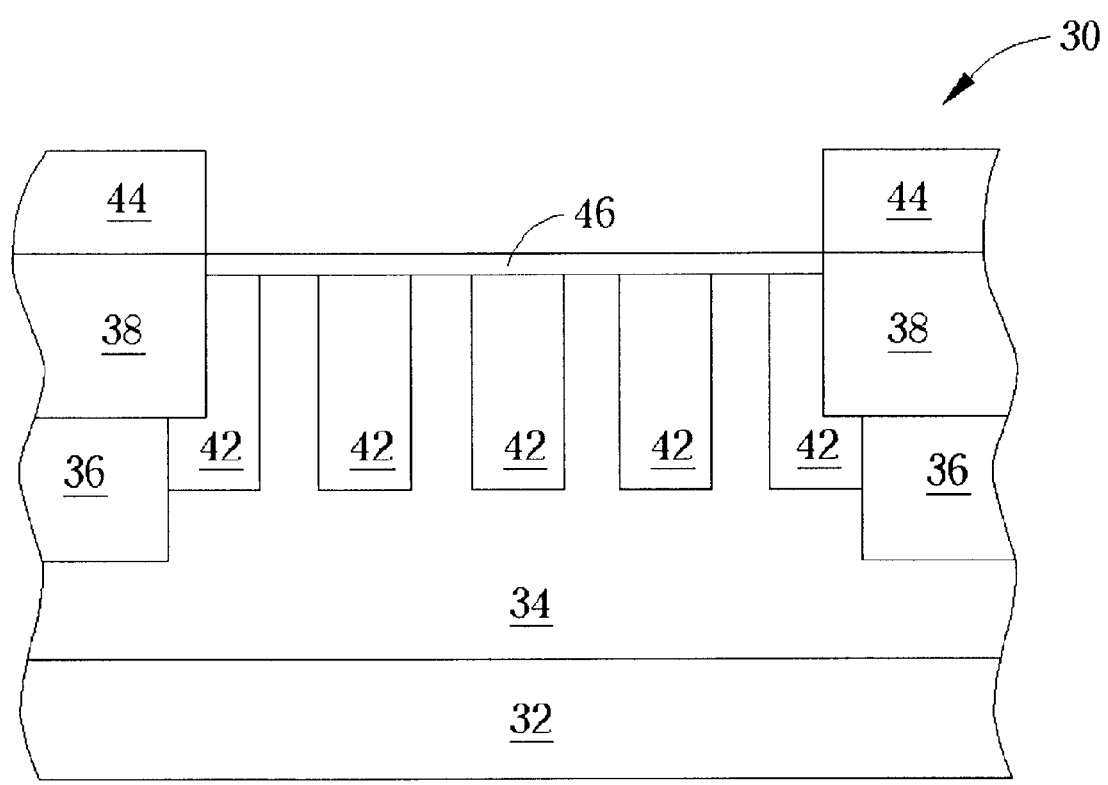

As shown in FIG. 4, another photolithography process is performed to form a photoresist layer 44 on the surface of the P-type substrate 32 for defining a position of a heavily doped region in the photo sensor. Then, using the photoresist layer 44 as a mask, a second ion implantation process is performed to form a doped region 46 on the surface of the photo sensor. The doped region 46 is overlapped with the upper portion of each doped regions 42. Noticeably, the implantation energy of the first ion implantation process should be smaller than that of the second ion implantation process, so that the junction depth produced by the doped region 46 and the P-type epitaxial layer 34 is smaller than the junction depth produced by the doped region 42 and the P-type epitaxial layer 34. In addition, the dopants used in the second ion implantation process can be the same as the dopants used in the first ion implantation process. That is, the second ion implantation process can use N-type dopants, such as arsenic or phosphorus. However, the dopant concentration of the first ion implantation process should be less than that of the second ion implantation process.

Figure 5:
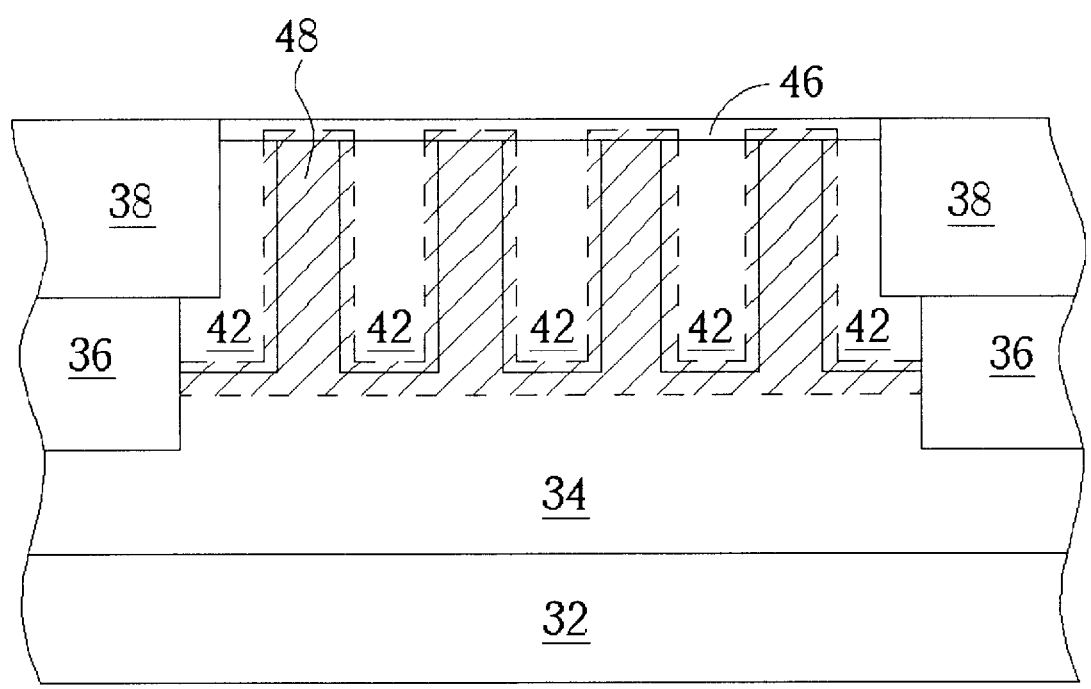

Finally, an annealing process is performed to drive-in the dopants of the doped region 42 and the doped region 46 into the P-type epitaxial silicon layer 34 as shown in FIG. 5. Following that, a plurality of depletion regions 48 is formed between the doped regions 42 and the P-type epitaxial silicon layer 34 and between the doped region 46 and the P-type epitaxial silicon layer 34. Furthermore, each of the depletion regions 48 is located under the doped region 46 and between the two adjacent doped regions 42, and extends under the doped regions 42. The fabrication of the photo sensor is therefore completed.

Because the present invention utilizes the first ion implantation process to form a plurality of doped regions 42 in the P-type epitaxial silicon layer 34, the contacting area between each first doped regions 42 and the P-type epitaxial silicon layer 34 is increased, thus effectively increasing the sensing area of the photo diode. That is, the area of the depletion region 48 is increased to increase photo current and improve the sensitivity of the photo diode. In addition, the doped region 46 is located on the surface of the P-type epitaxial silicon layer 34. The doped region 46 and the P-type epitaxial silicon layer 34 form a shallower depletion region for effectively improving the sensitivity of the photo diode to light with short wavelengths (such as blue light).

Furthermore, the doped region 46 is covered on the plurality of doped regions 42 in the photo diode according to the present invention. As a result, the doped region 46 can be used as a conducting wire of the photo sensor. Therefore, each doped region 42 can be applied with an equal voltage through the doped region 46. Because the doped regions 42 on both sides of a depletion region 48 are applied with an equal voltage, the depletion region 48 is a complete depletion region. That is, the depletion region 48 is in an open-circuit state and a capacitance of the depletion region 48 is approximately equal to zero. Thus, the sensing area of the photo diode is increased and the dark current of the photo diode is decreased. Due to increasing the photocurrent of the depletion region 48 and decreasing the capacitance of the depletion region 48, the photon conversion gain of the photo diode is increased and the performance of the photo diode is therefore improved.

Figure 6:
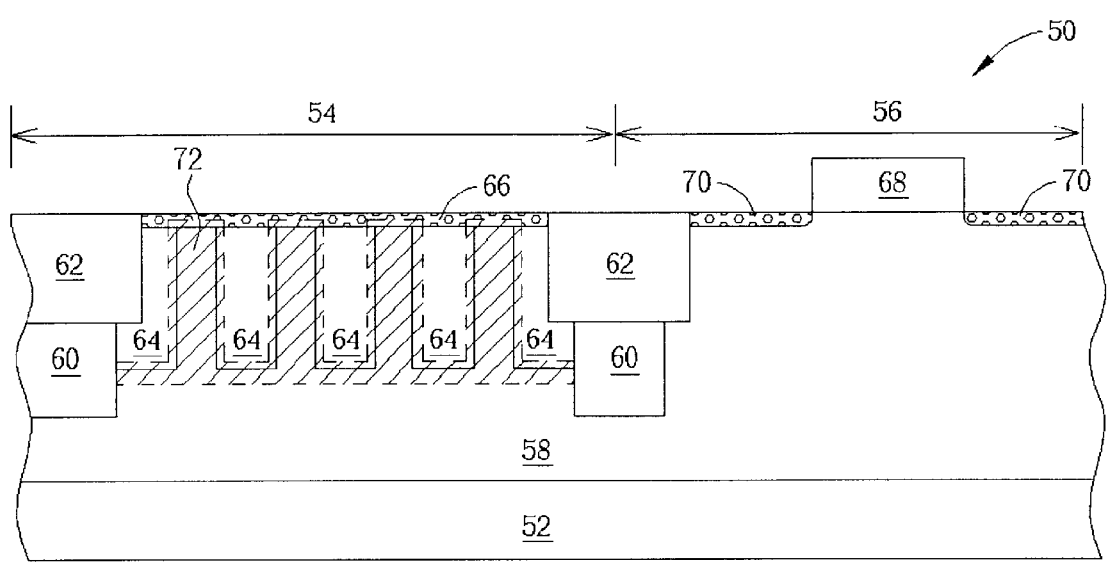
FIG. 6 is a schematic diagram of a photo sensor in a photo diode according to another embodiment of the present invention.

Please refer to FIG. 6. FIG. 6 is a schematic diagram of a photo sensor in a photo, diode according to another embodiment of the present invention. In this embodiment, the fabrication of forming a photo diode and the fabrication of forming a MOS transistor are integrated to simplify the manufacturing flow. As shown in FIG. 6, a semiconductor wafer 50 comprises a P-type substrate 52, a photo sensor region 54 and a logic circuit region 56 formed on the surface of the P-type substrate 52. A plurality of insulating layers 62, such as shallow isolation trench, is formed between the photo sensor region 54 and the logic circuit region 56. A photo diode is formed within the photo sensor region 54, and a MOS transistor is formed within the logic circuit region 56. In order to improve the electrical performance of the photo diode, a P-type epitaxial silicon layer 58 can be selectively located on the P-type substrate 52, and a plurality of P-type wells 60 can be selectively located under the insulating layer 62.

The photo sensor region 54 comprises a plurality of lightly doped regions 64, a heavily doped region 66 covered on the lightly doped regions 64, and a plurality of depletion regions 72 formed between the P-type epitaxial silicon layer 58 and the doped regions 64, 66. The logic circuit region 56 comprises a gate 68, and a lightly doped drain (LDD) 70 located in the P-type epitaxial silicon layer 58 of both sides of the gate 68. Noticeably, the doped region 66 and the lightly doped drain 70 are simultaneously formed by performing the same ion implantation process. Therefore, the damage to crystal lattice of the surface of the doped region 66 is reduced. In addition, the recombination rate of the photo charges and the leakage current are decreased. Furthermore, the fabrication of forming a photo diode and the fabrication of forming a MOS transistor are integrated to reduce production costs.

In comparison with the prior art, the present invention uses the first ion implantation process to form a plurality of first doped regions. Therefore, the contacting area between each first doped region and the substrate is increased so that the sensing area of the photo diode is effectively increased. As a result, the sensitivity of the photo diode is improved. In addition, the second doped region is overlapped with the upper portion of each first doped regions, so that the second doped region and the substrate form a depletion region close to the surface of the substrate. Therefore, the sensitivity of the photo diode to light with short wavelengths is effectively improved. Furthermore, the depletion region is a complete depletion region. Thus, the sensing area of the photo diode is increased and the dark current of the photo diode is decreased. The photocurrent of the depletion region and the photon conversion gain of the photo diode are further increased Those skilled in the art will readily observe that numerous modifications and alterations of the device may be made while retaining the teachings of the invention. Accordingly, the above disclosure should be construed as limited only by the metes and bound of the appended claims.

What is claimed is:

1. A photo sensor in a photo diode formed on a semiconductor wafer, a surface of the semiconductor wafer comprising a substrate with first-type dopants, and an insulating layer positioned on the substrate and surrounding the photo sensor, the photo sensor comprising:

a plurality of first doped regions with second-type dopants positioned on a surface of the photo sensor;

a second doped region with second-type dopants positioned atop the first doped regions, the second doped region being partially overlapped with each of the first doped regions; and a plurality of depletion regions, each of the depletion regions being located under the second doped region, between the two adjacent first doped regions, and extending under the two adjacent first doped regions, each of the depletion regions being a complete depletion region and having a capacitance approximately equal to zero for increasing a sensing area, decreasing dark current, and further increasing photo current, photon conversion gain, and the sensitivity of the photo sensor to blue light.

2. The photo sensor of the claim 1 wherein a doped well with first-type dopants is located beneath the insulating layer.

3. The photo sensor of the claim 1 wherein the first-type dopants are N-type, and the second-type dopants are P-type.

4. The photo sensor of the claim 1 wherein the first-type dopants are P-type, and the second-type dopants are N-type.

5. The method of claim 1 wherein the substrate further comprises an epitaxial silicon layer, and each of the first doped regions and the second doped region are formed inside the epitaxial silicon layer.

6. The method of claim 1 wherein a dopant density of the first doped region is less than a dopant density of the second doped region.

7. The method of claim 1 wherein the second doped region is utilized to be a conducting wire of the photo sensor.

* * * * *